United States Patent [19]

Sato

[11] Patent Number: 4,701,803
[45] Date of Patent: Oct. 20, 1987

[54] IMAGE DATA COMPRESSION APPARATUS

[75] Inventor: Yukio Sato, Inagi, Japan

[73] Assignee: Canon Kabushiki Kaisha, Tokyo, Japan

[21] Appl. No.: 739,072

[22] Filed: May 29, 1985

[30] Foreign Application Priority Data

Jun. 5, 1984 [JP] Japan ................................ 59-114838
Jun. 5, 1984 [JP] Japan ................................ 59-114839
Jun. 5, 1984 [JP] Japan ................................ 59-114840

[51] Int. Cl.$^4$ ............................................. H04N 1/40
[52] U.S. Cl. ..................................... 358/260; 358/261
[58] Field of Search ............... 358/260, 261, 264, 293; 340/347 DD

[56] References Cited

U.S. PATENT DOCUMENTS

| | | | |
|---|---|---|---|
| 3,941,921 | 3/1976 | Tsuchiya et al. | 358/261 |
| 3,974,326 | 8/1976 | Rosdolosky et al. | 358/261 |
| 3,991,267 | 11/1976 | Beaudette et al. | 358/261 |
| 4,096,527 | 6/1978 | Furuta | 358/261 |
| 4,131,915 | 12/1978 | Nakagome et al. | 358/261 |
| 4,223,356 | 9/1980 | Renelt et al. | 358/261 |
| 4,290,085 | 9/1981 | Kolker | 358/264 |

Primary Examiner—Edward L. Coles, Sr.
Attorney, Agent, or Firm—Fitzpatrick, Cella, Harper & Scinto

[57] ABSTRACT

An image data compression apparatus has a CCD for reading an original image, a counter for counting the number of continuous white or black pels in the image data, and a copression circuit for compressing read image data and generating MH codes including EOL and RTC signals. The compression apparatus can compress image data of a long run length at high speed and can process image data starting with a black component.

10 Claims, 11 Drawing Figures

IMAGE DATA COMPRESSION APPARATUS

BACKGROUND OF THE INVENTION

1. Field of the Invention

The present invention relates to an image data compression apparatus used in a facsimile system, an image electronic file or the like and, more particularly, to an image data compression apparatus suitable for high-resolution image processing.

2. Description of the Prior Art

In conventional image transfer apparatuses such as facsimile systems and the latent image file apparatuses using optical disks, magnetic disks or the like, image data is compressed to decrease the amount of data, thereby achieving high-speed transmission and accumulation with high efficiency.

Image compression is a kind of code conversion which is typically exemplified by modified Huffman (MH) coding. According to MH coding, continuous strings of white or black pels in the image are expressed by a corresponding code. In this case, the most frequent pel number corresponds to a short code, and a rarely appearing pel number corresponds to a long code. The entire image can be expressed by a smaller number of bits in another code string by utilizing occurrence frequency for combinations of pels.

A data format using MH coding defines an EOL (end of line) code representing a boundary of an MH code group representing a one-line image, and an RTC (return to control) signal representing a boundary of a one-page image. A receiving end, i.e., a decoding processor, performs synchronous decoding in response to the EOL code and the RTC signal.

A high-speed, high-resolution printer such as a laser beam printer using electrophotographic process has recently been developed. Demand has arisen for reproduction (recording) of a compressed image by using such a printer. Along with this demand, a high-speed optical reader is also necessary for reading the image to be printed at the printer. As a result, compression and decoding must be performed at higher speeds.

Since the EOL code and the RTC signal play an important role as described above, their formation becomes an important issue. In particular, an apparatus for generating the EOL code and the RTC signal is required to perform real-time high-speed processing in a facsimile system wherein a reader, a compression apparatus, a printer and the like are independently operated with high speed.

The MH codes includes two types of codes: a terminating code and a makeup code. Numbers corresponding to 0 to 63 pels (run length) are represented by terminating codes, respectively. Numbers 64, 128, 256, ... 2560 corresponding to pels in units of 64 pels are represented by makeup codes, respectively. A run length of 0 to 63 pels is represented by one terminating code, but a run length of 64 or longer is represented by a combination of a makeup code and a terminating code. For example, an image having a continuous string of 515-bit white pels can be expressed as (01100101) (1000), which is a combination of a makeup code (01100101) representing a white run length 512 and a terminating code (1000) representing a white run length 3, since $515 = 64 \times 8 + 3 = 512 + 3$.

In this manner, the terminating code and the makeup code can display maximum run lengths of 63 and 2560, respectively. When these codes are combined, a maximum of 2,623 (=2,560+63) bits can be expressed by an MH code.

In the laser beam printer described above, high-density recording/reproduction can be performed at 16 dots/mm. Therefore, a corresponding resolution is required in the reader for optically reading the image to be reproduced at the printer.

Assume that an original having an A4 (210 mm × 297 mm) size is read with a resolution of 16 dots/mm. In this case, the total number of pels to be read is 3,360 × 4,752 (dots). When compression processing is performed using the above-mentioned MH coding, a run length which cannot be expressed by 2,560 + 63 bits is formed. In order to express a run length exceeding 2,653 bits, extended coding can be proposed wherein two makeup codes are used in the form of, for example, (makeup code) + (makeup code) + (terminating code).

When a one-line image along a short side of an A4-size original subjected to scanning with a resolution of 16 dots/mm comprises white pels (3,360 bits), 3,360-bits continuous white pels can be expressed by combining three MH codes, i.e., a makeup code (000000011111) representing 2,560 bits, a makeup code (011001101) representing 768 bits, and a terminating code (00011011) representing 32 bits, since 3,360=2,560+768+32.

An image having a run length of about 5,000 bits can be expressed by MH codes consisting of make up and terminating codes. In this case, however, the length of the MH code is considerably long. When a long MH code is generated at once, data conversion is overloaded. In addition, generation of the MH code is delayed, resulting in inconvenience. This drawback interferes with high-speed image transmission.

The first MH code of one line must represent a white image in accordance with a CCITT recommendation for MH coding. When a one-line image starts with a black image, an MH code of a white image having a run length 0 is inserted before an MH code for a black image, i.e., after an EOL (end of line) code. However, hardware for generating the MH code of a white image having tne run length 0 is complicated.

SUMMARY OF THE INVENTION

The present invention has been made in consideration of the above situation and has as its object to provide an image data compression apparatus which can perform real-time compression at high speed.

It is anotner object of the present invention to provlde an image data compression apparatus for compressing an image having a relatively long run length at high speed.

It is still another object of the present invention to provide an image data compression apparatus for effectively compressing an image starting with a black line.

It is still another object of the present invention to provide an image data compression apparatus suitable for facsimile communications using a digital transmission line.

Tne above and other objects, features and advantages of the present invention will be apparent from the following detailed description taken in conjunction with the accompanying drawings.

DETAILED DESCRIPTION OF THE PREFERRED EMBODIMENTS

Figure 1:
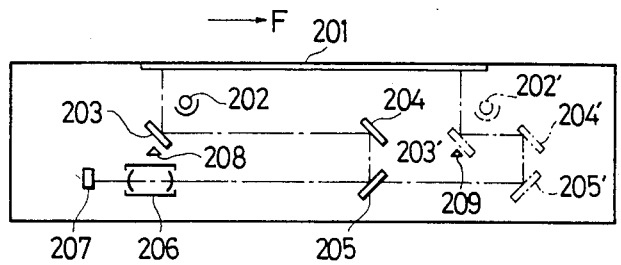
FIG. 1 is a sectional view of a reader which employs the present invention.

The present invention will be described in detail with reference to the accompanying drawings. FIG. 1 is a sectional view of a reader which employs the present invention.

The reader comprises an original table glass plate 201, a rod-like light source 202 such as a halogen lamp or a fluorescent lamp, a first mirror 203, a second mirror 204, a third mirror 205, a lens 206 and a one-dimensional solid-state image pickup element such as a CCD 207.

In operation, an original placed on the original table glass plate 201 is illuminated by the light source 202. Light reflected from the original is focused by the lens 206 on the CCD 207 through the first, second and third mirrors 203, 204 and 205. The main scanning direction of the CCD 207 is a direction perpendicular to the drawing surface. The light source 202 and the first mirror 203 are integrally formed with a support member (not shown) and guided along a guide rail (not shown) along the F direction, thereby scanning (subscanning) tne original surface. The second and third mirrors 204 and 205 are integrally formed with a support member (not shown) and guided in the same direction as that of the first mirror 203 at a ½ speed thereof along a guide rail (not shown). The light source 202, the first mirror 203, the second mirror 204 and the third mirror 205 are moved from read start positions indicated by solid lines to read end positions (202', 203', 204' and 205'; indicated by dotted lines, respectively. The length of the optical path from the original table 201 to the lens 206 through the mirrors 203, 204 and 205 is always kept constant.

The reader subscans the A4 original along its longitudinal direction and has a read line density of 16 lines/mm. The reader has a resolution of 16 pels/mm along the main scanning direction. The number of output bits for one line along the main scanning direction is 3,360, and 4,752 lines are scanned along the main scanning direction.

The entire image of the original can be read to generate image signals having levels corresponding to the densities of the original image in units of lines.

The reader also comprises an original read start sensor 208 and an original read end sensor 209. These sensors comprise photointerrupters, respectively, and are operated by an actuator (not shown) arranged in the first mirror 203, respectively. When the first mirror 203 is located at a position corresponding to tne sensor 208 or 209, the sensor 208 or 209 generates an output.

When the original is read, the mirrors and the light source are returned to the solid line positions at high speed.

Figure 2:
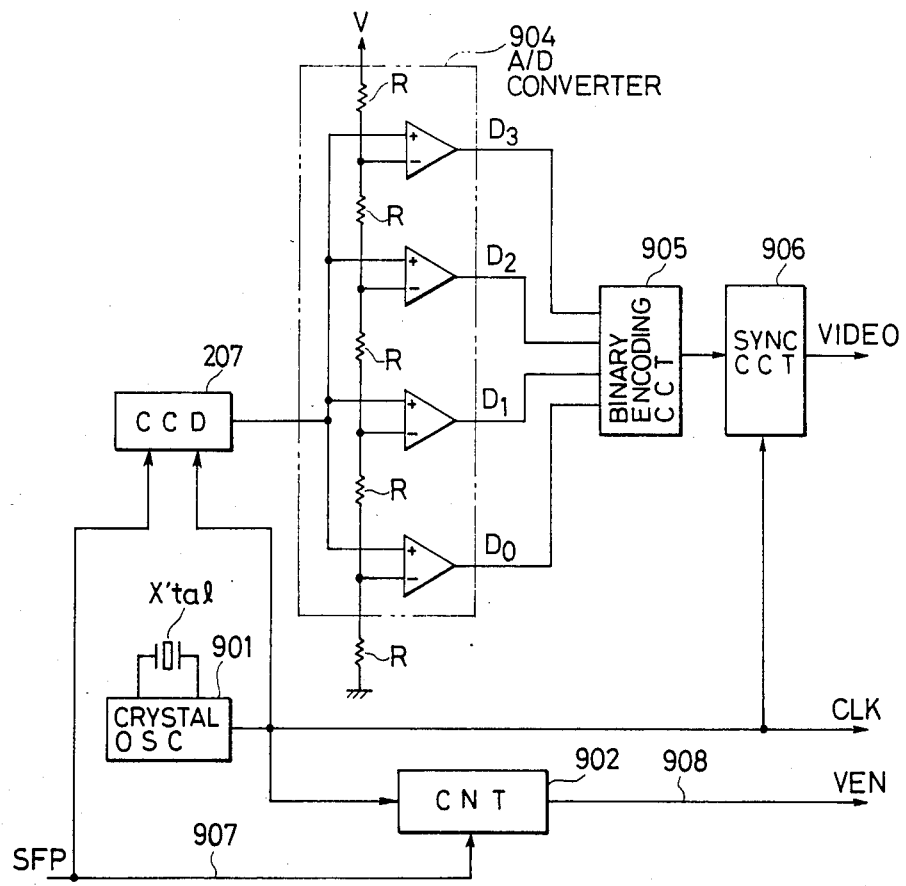
FIG. 2 is a diagram of a CCD driver.

FIG. 2 is a diagram of a driver for the CCD 207 shown in FIG. 1. The CCD 207 is the same as the CCD (photoelectric transducer element) shown in FIG. 1. A crystal oscillator 901 generates a clock signal CLK as a reference for image reading. A counter 902 counts the clock signal generated from the crystal oscillator 901. The counter 902 generates an output 908 of high level in response to a shift pulse (SFP) 907 designating starting of shift register transfer, and at the same time starts counting the clock signal. When the counter 902 counts to the number of pels of one line (3,360 pels in this embodiment), the output 908 of low level is generated. The output 908 thus represents an output duration of the image signals of each line and is used as a video enable signal VEN (horizontal sync signal) to be described later.

An A/D converter 904 converts to a 4-bit (16 gradations) digital signal an analog output having a level corresponding to a density of an image represented by the image signal generated by the CCD 207. The A/D converter 904 comprises four comparators for comparing voltages shunted by resistors R with the signal from the CCD 207 and for generating outputs (i.e., bits) $D_0$ to $D_3$. The 4-bit digital signal from tne A/D converter 904 is subjected to binary encoding by comparing the digital signal with a fixed threshold or binary encoding using a dither scheme for achieving half-tone reproduction. The binary encoding of the 4-bit digital signal is performed by a binary encoding circuit 905. The binary-encoded signal is synchronized by a sync circuit 906 with the clock signal CLK, thereby obtaining a serial signal. The serial signal is a binary-encoded image signal.

Figure 3:
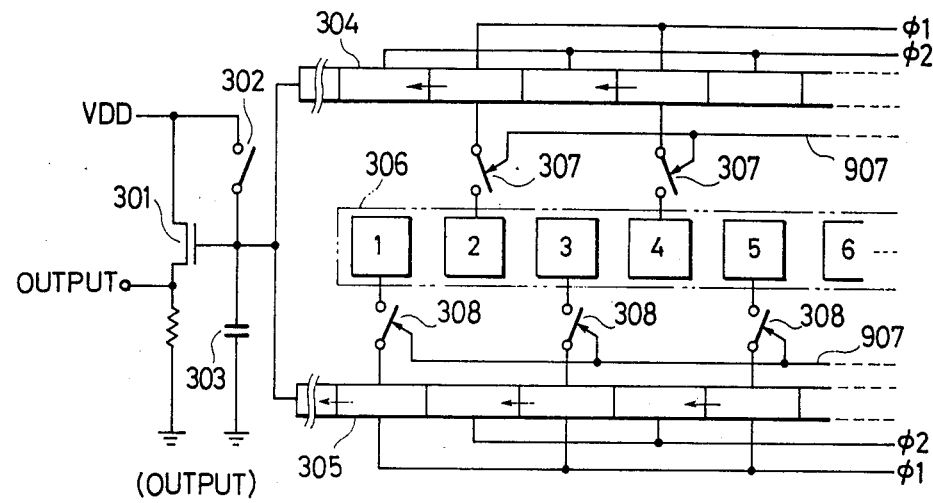
FIG. 3 is a circuit diagram of a CCD.

FIG. 3 shows the schematic arrangement of tne CCD 207. The CCD 207 has an output transistor 301, a capacitor memory 303 for holding an output voltage, and a reset switch 302 for recharging the capacitor memory 303.

An imaging unit 306 has light-receiving elements 1, 2, . . . each corresponding to one pel. Light reflected by the original is incident on the imaging unit 306. The light-receiving elements, 1, 2, . . . are charged in accordance with light intensity levels. The components charged by the light-receiving elements, 1, 2, . . . are divided into even- and odd-numbered components which are parallel-shifted to CCD shift registers 304 and 305, respectively. The shift timing corresponds to the input timing of the shift pulse (SFP) 907. Gates 307 and 308 are enabled in response ro the shift pulse.

The parallel-shifted components in the CCD shift registers 304 and 305 are sequentially transferred to the left in response to the clock pulses $\phi 1$ and $\phi 2$. The even- and odd-numbered components are alternately supplied to the output transistor 301.

Figure 4:
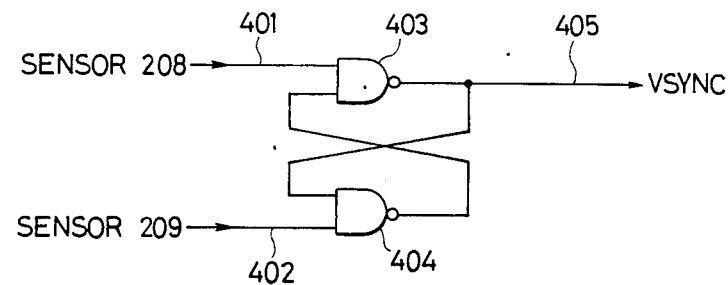
FIG. 4 is a circuit diagram of a circuit for generating a vertical sync signal.

FIG. 4 shows a circuit for generating a vertical sync signal VSYNC in accordance with outputs from the original read start and end sensors 208 and 209. In this circuit, two NAND gares 403 and 404 constitute a known flip-flop. An input 401 to the NAND gate 403 is connected to an output from the original read start sensor 208, and the output from the original read end sensor 209 is connected to an input 402 of the NAND gate 404. An output 405 from the flip-flop is set at high level for a period of time between the output from the original read start sensor 208 and the output from the original read end sensor 209. The signal of high level comprises the vertical sync signal VSYNC. In other words, the vertical sync signal VSYNC is enabled upon starting of the original reading by the CCD 207 and disabled upon the end of one-image reading. In this embodiment, the vertical sync signal is generated by a position sensor for a mirror moving during original scanning (reading). However, another technique may be used. For example, a main scanning line number can be counted after the CCD 207 starts reading the original and when the count has reached a predetermined value (i.e., the value corresponding to a size of an original to be read), the vertical sync signal VSYNC is thereby obtained.

Figure 5:
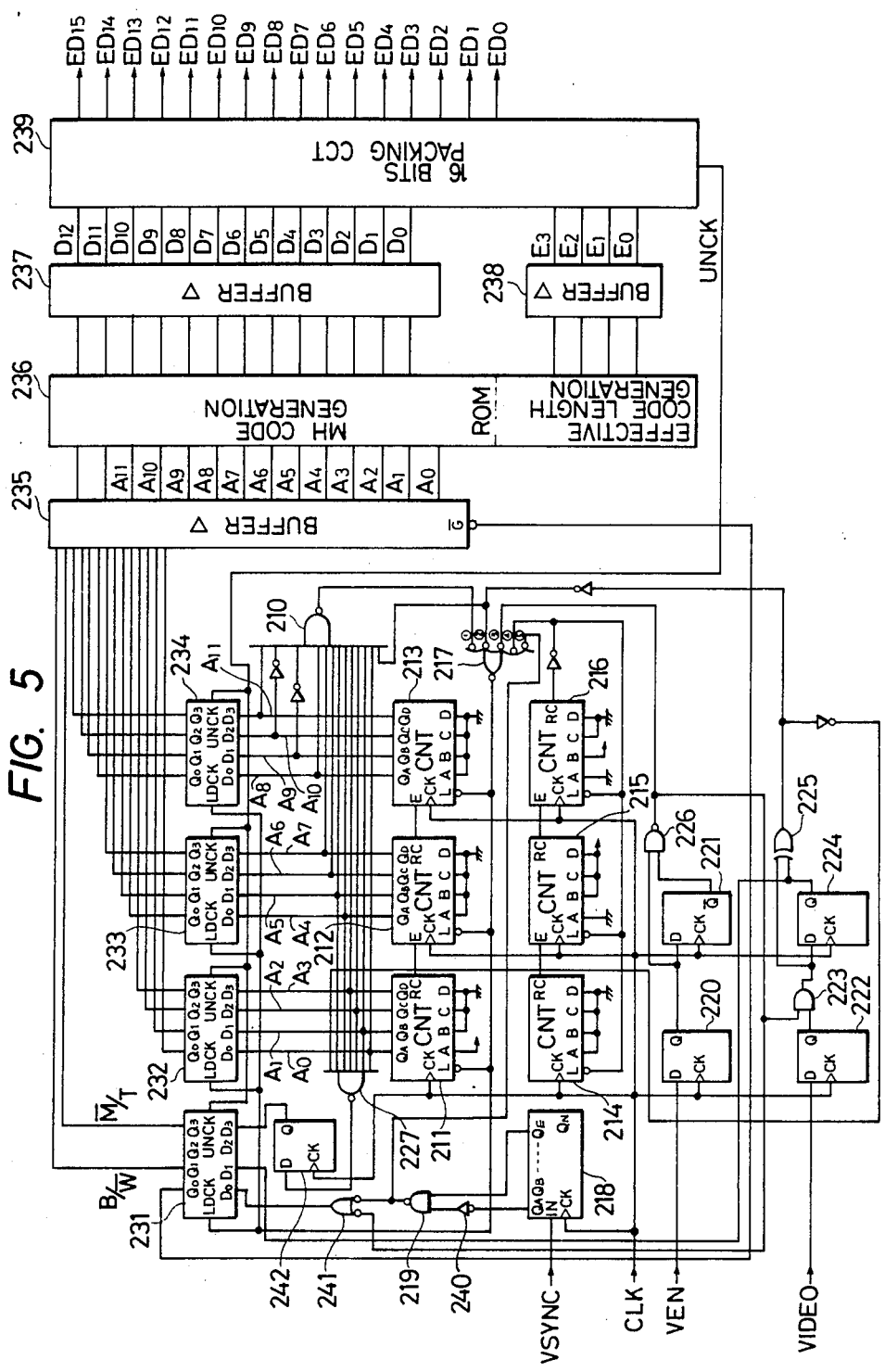
FIG. 5 is a circuit diagram of a compression processor.

FIG. 5 is a circuit diagram of a compression circuit for compressing the binary-coded signal read by the reader of FIG. 1 in accordance with modified Huffman (MH) coding to obtain an MH code.

The compression circuit receives the image signal VIDEO, rhe clock signal CLK, the video enable signal VEN and tne vertical sync signal VSYNC.

D flip-flops 220 and 221 are operated in response to the clock signal. The video enable signal VEN is supplied to the flip-flop 220, and a Q output therefrom is supplied to the flip-flop 221. Therefore, the video enable signal VEN is delayed by the flip-flop 220 by one clock and by the flip-flop 221 by two clocks. The Q output from the flip-flop 220 and a $\overline{Q}$ output from tne flip-flop 221 are supplied to a NAND gate 226, thereby detecting a leading edge of the video enable signal VEN. An output signal from the NAND gate 226 goes low at the leading edge ot the signal VEN. When the signal of low level is generated from the NAND gate 226, the one-line image signal VIDEO is entered. Therefore, the low level output from the NAND gate 226 is called an EOL detection signal.

D flip-flops 222 and 224 are operated in response to the clock signal CLK. The flip-flop 222 receives the image signal VIDEO, and the flip-flop 224 receives the Q output from the flip-flop 222 through an AND gate 223.

The image signal VIDEO is delayed by the flip-flop 222 by one clock and the flip-flop 224 by two clocks. A Q output from the flip-flop 222 and a Q output from the flip-flop 224 are supplied to an exclusive OR gate 225 to detect a transition point or alteration from the white component to the black component and vice versa. Upon detection of the alteration, the output from the exclusive OR gate 225 goes high. This high level signal is called an alteration detection signal.

An 8-bit shift register 218 performs shifting in response to the clock signal CLK. The shift register 218 receives the vertical sync signal VSYNC which is delayed by 8 clocks QA to QH. The output QA from the shift register 218 is supplied to one input terminal of a NAND gate 219 through an inverting gate 240. The output QE from tne shift register 218 is supplied to the other input terminal of the NAND gate 219. An output from tne NAND gate 219 is held low for 5-clock period upon falling of the vertical sync signal VSYNC. This low level output represents a timing of an end of the one-page video signal VIDEO, thereby controlling a signal RTC representing an end of a one-page image.

4-bit counters 211, 212 and 213 are connected in series with each other to constitute a 12-bit counter. The 12-bit counter is called a run length counter to count the clock signals CLK. The LSB of the counter 211 is set at logic "1".

Outputs QA to QD from the counter 211, outputs QA and QB from the counter 212, outputs QA and QD from the counter 213, outputs $\overline{QB}$ and $\overline{QC}$ obtained by inverting the outputs QB and QC from the counter 213, and an inverted signal of the alteration detection signal from the exclusive OR gate 225 are supplied to a NAND gate 210. When a count of the 12-bit counter reaches "101111111111" (i.e., 2559), an output from the NAND gate 210 goes low. The low level signal from the NAND gate 210 is called a 2560 detection signal.

4-bit counters 214, 215 and 216 are connected in series with each other to constitute a 12-bit counter. The 12-bit counter is called a line counter for counting the clock signal CLK. The line counter can count a value larger by one than the one-line pel number (i.e., 3,360). This is because the line counter is arranged to perform the same counting as that of the run length counter since the run length counter starts with 1. When the clock pulses (3,360) for one line are counted, the counter 216 generates a ripple carry signal RC. The ripple carry signal is called a line end signal. The line end signal clears the counters 214 to 216.

A negative logic OR gate 217 controls generation of an MH code. Five types of inputs are supplied to the OR gate 217: (1) the 2560 detection signal from the NAND gate 210; (2) an inverted signal of the alteration detection signal from the exclusive OR gate 225; (3) the EOL detection signal from the NAND gate 226; (4) the line end signal from the line counter; and (5) the low level output from the NAND gate 219. When any one of the inputs to the OR gate 217 is set at low level, the gare 217 generates a low level output.

The count of the run length counter is cleared in response to the low level output from the OR gate 217. In other words, the run length counter is cleared in one of the following cases wherein an alteration of the image signal is detected: the line end signal or the video enable signal VEN rises, the vertical sync signal VSYNC rises, or a white or black run length is continuous for 2560 bits. The low level signal from the OR gate 217 causes registers 231 to 234 to receive data in a manner to be described below.

The registers 231 to 234 comprise first-in first out (FIFO) registers, respectively. The registers 231 to 234 fetch data supplied to the input terminals $D_0$ to $D_3$ in response to the low level output from the OR gate 217 and generate data in response to a UNCK signal (to be described later). The registers 231 to 234 receive 12-bit parallel count data from the run length counter. In other words, the registers 232 to 234 receive a run length obtained at the time when the output from the OR gate 217 is set at low level. The register 231 receives an output from an OR gate 241 at the input terminal $D_0$ thereof, the Q output from the flip-flop 224 at the input terminal $D_1$ thereof, and the output from the NAND gate 227 at the input terminal $D_3$ thereof.

The OR gate 241 generates an output of high level in response to one of the low level outputs from the NAND gate 219 and the low level output (i.e., the EOL detection signal) from the NAND gate 226. The high level signal from the OR gate 241 is transmitted to the $\overline{G}$ input to a buffer 235 through an output $Q_0$ of the register 231, thereby setting the buffer 235 in the EOL code generation enable state (to be described below).

A one-clock EOL code can be generated in response to the EOL detection signal from the NAND gate 226. The low level signal from the NAND gate 219 can cause generation of the 5-clock EOL code. A continuous signal consisting of a plurality of EOL codes comprises an RTC signal representing the end of one-page image signal VIDEO. Therefore, the 5-clock EOL code constitutes the RTC signal.

The one-clock EOL code is generated in response to rising of the video enable signal VEN as the horizontal sync signal of the image signal VIDEO. A 5-clock EOL code (i.e., the RTC signal) is generated in response to falling of the vertical sync signal VSYNC. Therefore, the EOL code is accurately generated at the beginning of one line of the image, and the RTC signal can also be accurately generated at the end of one page. This operation is precisely synchronized with the image read operation of an input device (e.g., a reader) for receiving the image signal to be compressed. The EOL code and the RTC signal are generated simultaneously upon image reading.

An input (i.e., the Q output from the flip-flop 224) to the input terminal $D_1$ of the register 231 comprises a B/$\overline{W}$ signal representing that the input image signal comprises a black or white component. When the B/$\overline{W}$ signal is set at high level, it represents the black component. However, when the B/$\overline{W}$ signal is set at low level, it represents the white component. The input signal to the input terminal $D_1$ is generated from the output terminal $Q_1$ and supplied to the buffer 235.

The NAND gate 227 receives the outputs QA to AD from the counter 211 in the run length counter, the outputs QA and QB from the counter 212 in the run length counter, and an inverted signal of the alteration detection signal. When all input signals are set at logic "1", a low level output from the NAND gate 227 is supplied to the input terminal $D_3$ of the register 231 through a flip-flop 242. When all lower six bits of the 12-bit count data are set at logic "1" (i.e., the run length is 63), the run length can be discriminated to be longer than 63. Therefore, when the output from the NAND gate 227 is set at low level, a makeup code must be generated. The output from the NAND gate 227 comprises an $\overline{M/T}$ signal which represents a makeup code at low level and a terminating code at high level. The $\overline{M/T}$ signal is delayed by the flip-flop 242 by one clock, and the one-clock delayed signal is supplied from the register 231 to the buffer 235.

When the $\overline{G}$ input (i.e., a gate input) is set at low level, the buffer 235 buffers the outputs from the four FIFO registers 231 to 234. However, when the EOL code is generated, the $\overline{G}$ input of the buffer 235 is set at high level, so that all outputs $A_0$ to $A_{11}$ therefrom are set at logic "1". The high level signal to the $\overline{G}$ input of the buffer 235 comprises the $Q_0$ output from the register 231, as described above.

A ROM (read-only memory) 236 is used for MH code generation and effective code length generation. The ROM 236 stores MH codes of respective white and black run lengths. The ROM 236 is addressed in response to the run length data generated from the FIFO registers 231 to 234 and supplied through the buffer 235, the $\overline{M/T}$ signal, the B/$\overline{W}$ signal and the EOL output (flag) and reads out the corresponding MH codes. As described above, when generation of the EOL code is required, all the outputs $A_0$ to $A_{11}$ from the buffer 235 are set at logic "1" in response to the $\overline{G}$ input thereto. The EOL codes can be read out from the ROM 236 in response to the outputs $A_0$ to $A_{11}$ which are all set at logic "1".

Buffers 237 and 238 transmit the output from the ROM 236 to a packing circuit 239. The packing circuit 239 comprises a 16 bits packing circuit for converting an MH code having an infinite length to a data string having a predetermined length (i.e., 16 bits). The packed data string having the predetermined length is generated as parallel data. The signal UNCK in the packing circuit 239 is generated when 16-bit packing is completed or the next MH code is required, thereby causing the FIFO registers 231 to 234 to generate data therefrom, thereby addressing the ROM 236 through the buffer 235.

Figure 6:
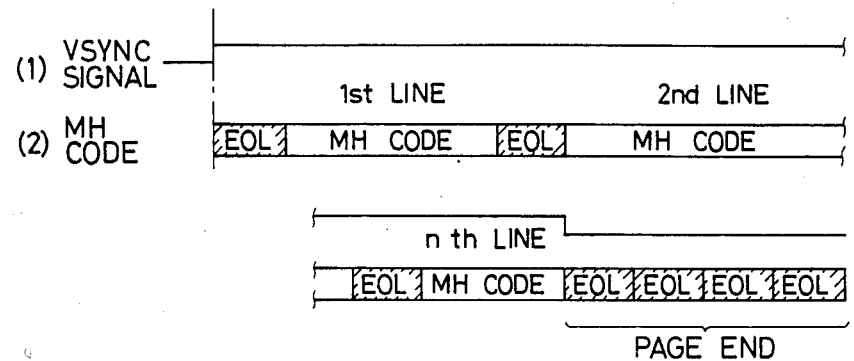
FIG. 6 is a timing chart showing a data format of MH coding.

The operation of the circuit shown in FIG. 5 will be described. The data format by the MH coding system is illustrated in FIG. 6(2). More specifically, the MH codes representing the image data are continuously transmitted in units of lines. The EOL code is inserted between lines so as to indicate a boundary between the lines. The RTC signal having a continuous signal of a plurality of EOL codes is added to the n-line MH codes of one page. Therefore, the receiving end, i.e., the decoding processor, synchronously receives the transmitted data in accordance with the EOL code. The decoding processor can recognize a boundary of images in accordance with the RTC signal. FIG. 6(1) shows the vertical sync signal representing the MH code duration of one page.

Figure 7:
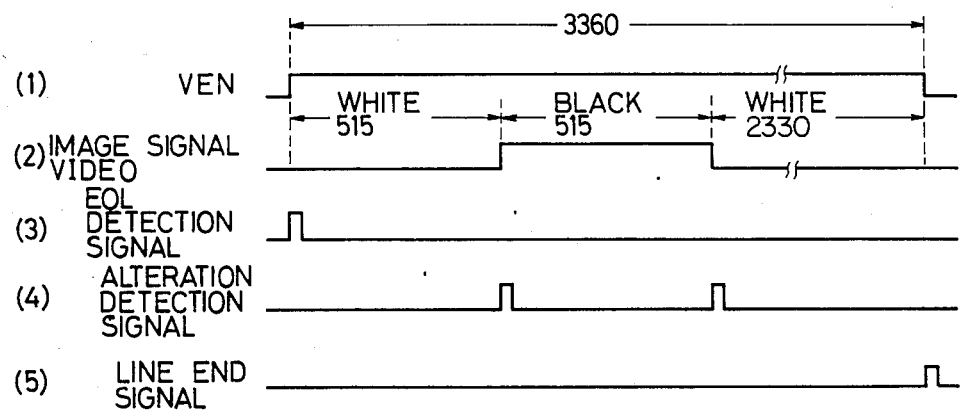
FIGS. 7 to 11 are respectively timing charts for explaining the operation of the circuit (FIG. 5) for processing an image signal.

FIG. 7 shows a one-line image signal VIDEO consisting of a 515-bit white component, a 515-bit black component and a 2,330-bit white component of 3,360 bits of one line. FIG. 7(1) shows the video enable signal VEN which is set at high level at the beginning of the 3,360-bit one-line image and disabled at the end of the one-line image. The EOL detection signal (3) is generated from the NAND gate 226 of FIG. 5 at the leading edge of the video enable signal VEN. The alteration detection signal (4) is generated from the exclusive OR gate 225 of FIG. 5 in response to a change in image signal from the white component to the black component and vice versa. The line end signal (5) is synchronized with the end of the 3,360-bit one-line image signal and generated from the line counter of FIG. 5.

The EOL code is generated in response to the EOL detection signal. The MH code corresponding to the run length at a given time is generated in response to the alteration detection signal and the line end signal, as described above.

Figure 8:
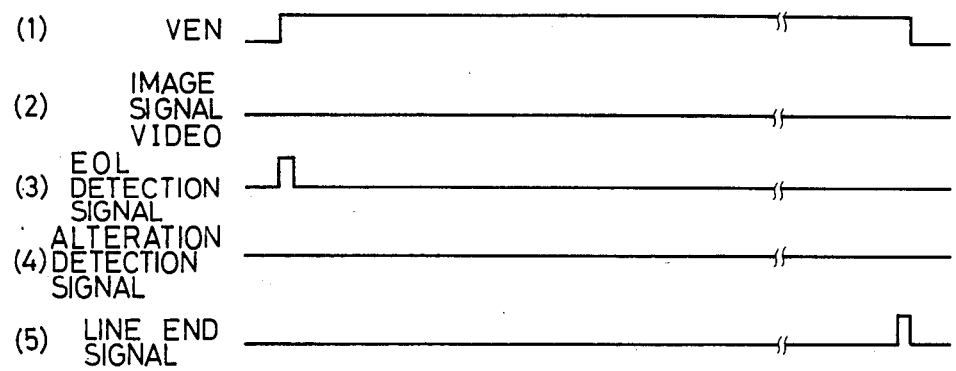

FIG. 8 shows a case wherein a 3,360-bit one-line image comprises a white image. Referring to FIG. 8, the EOL detection signal and the line end signal are generated in the same manner as in FIG. 7. However, since no change occurs in the image signal VIDEO, the alteration detection signal is not generated. The MH code having a change point within one line is not generated. Therefore, the MH code for the one-line image is generated only when the line end signal (5) is generated. At this moment, a number of MH codes (e.g., two makeup codes and one terminating code) must be generated. As a result, the compression apparatus is overloaded when the line end signal is generated.

Figure 9:
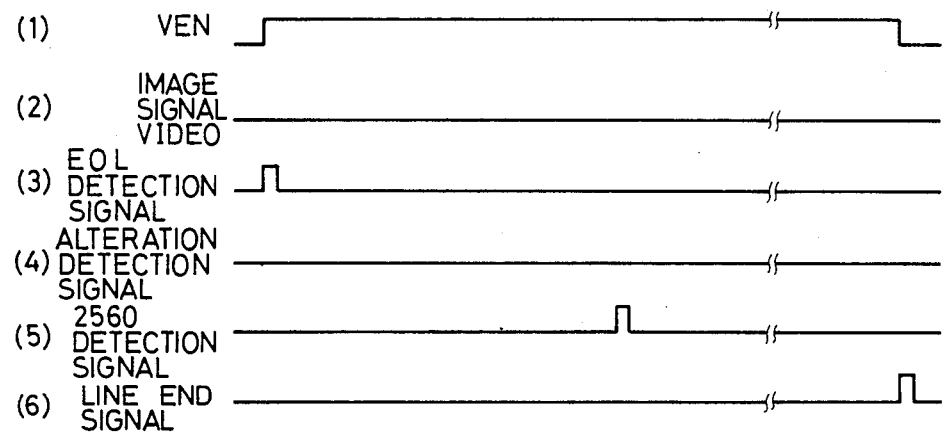

In the above case, the 2560 detection signal from the NAND gate 210 is used to forcibly generate an MH code upon generation of 2,560-bit pels even if an alteration of the image is not detected over a long period of time, thereby decreasing loading of MH code generation. FIG. 9 shows a case wherein the 2560 detection signal is used. The EOL detection signal (3) and the line end signal (6) are generated in the same manner as in FIG. 8. Unlike the case in FIG. 8, the 2560 detection signal (5) is generated within one line. The MH code corresponding to the run length of 2,560 bits is generated upon generation of the 2560 detection signal. Thereafter, the MH code corresponding to the run length of 800 bits is generated upon generation of the line end signal. In this manner, even if the alteration detection signal is not generated over a long period of time, generation of the MH codes is not concentrated and these can be generated in a time-division manner.

FIG. 9 shows the case wherein all the pels of one line comprise white and black pels. However, when a white or black image continues over 2560 bits, the MH code corresponding to the run length of 2,560 bits can be generated upon generation of the 2560 detection signal. Upon detecting the subsequent alteration, the MH code corresponding to the remaining run length is generated.

Figure 10:
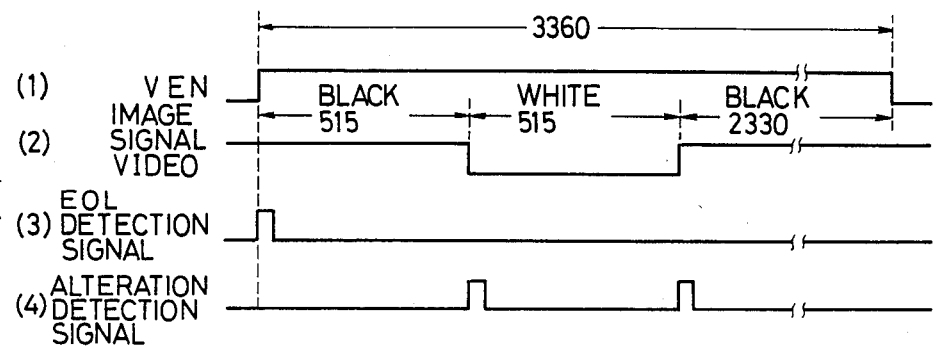
Figure 11:
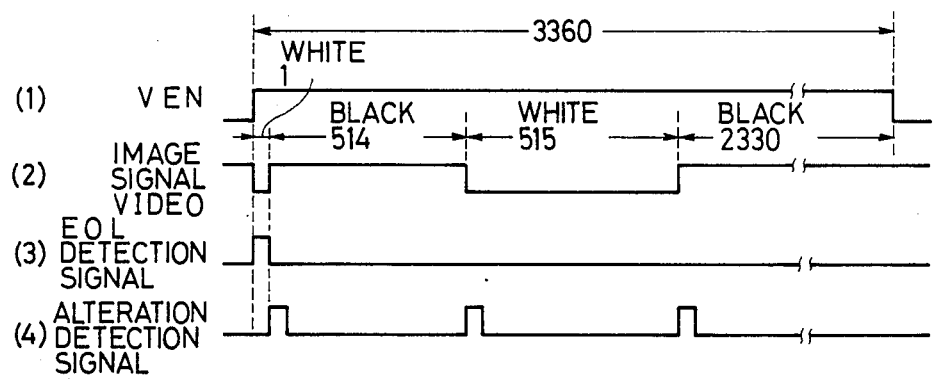

FIG. 10 shows a case wherein the image signal VIDEO from the reader starts with the black image. The one-line 3,360-bit image comprises a 515-bit black image, a 515-bit white image and a 2,330-bit white image. The relationship between the white and black images in FIG. 7 is reversed.

The MH codes are sequentially generated starting with the code representing the run length of 515 bits of the black image. According to the CCITT recommendation, one line must be started with a white MH code.

In this case, it is natural that a white image having a run length of 0 bit be added to the black image having the run length of 515 bits.

However, when the initial value of the run length counter is set to be "0" and the MH code corresponding to the run length of 0 bit is generated, the circuit size is increased, thus often resulting in inconvenience. In general, a minimum run length of the white or black image is 1 bit. More frequently, the run length is more than 1 bit.

The initial value of the run length counter is constantly set at logic "1" to simplify the circuit arrangement and to decrease the circuit space, as shown in FIG. 5. Among the first 515 bits of the run length of the black image, the first one bit is converted to a run length 1 of the white image. Therefore, a white image MH code having a run length of 0 need not be inserted.

In this case, the first one bit of the black image data is converted to that of a white image. However, even if the first one bit among 3,360 bits of the one-line image represents a white image, no trouble occurs with the image reproduced on the screen. In practice, the first bit will not appear on the screen since it falls outside the effective image, thus eliminating any practical problem.

The above scheme is achieved by the AND gate 223 of FIG. 5. The output from the flip-flop 222 is gated in response to the EOL detection signal from the NAND gate 226 to forcibly set the output from the flip-flop 222 at low level (white image) for one-clock period. The A input to the counter 211 of FIG. 5 is set at high level so as to constantly set the initial value of the run length counter to be "1". This is because in this embodiment a count of 0 need not appear in the counter so as to generate the MH code of the white image having a run length of 0 bit.

The present invention is exemplified by a facsimle system. The present invention can also be applied to other data compression processing in an electronic file or the like. The coding system is not limited to MH coding, but can be extended to a similar compression system.

When an image having a relatively long run length is to be compressed, the compression codes can be time-divisionally generated so that data compression will not be concentrated at a given time.

Furthermore, even if one line starts with a black image, the MH code corresponding to a white image having zero run length need not be generated. A simple MH code at the beginning of one line can be generated.

Again, a line boundary code and a page boundary code which are to be added to the compression codes of the image data are generated in synchronism with the image data input to be compressed, thereby achieving real-time compression at high speed.

What is claimed is:

1. An image data compression apparatus comprising:
   means for entering binary signals representing that each pel thereof is a white or a black pel;
   means for counting numbers of continuous white and black pels of the binary signals entered from said input means;
   means for detecting a changing point of the color related to the binary signals entered from said input means;
   compression means for generating a compressed image code or codes representing a count of said counting means when said changing point is detected by said detecting means; and
   means for discriminating that a count of said counting means has reached a predetermined value;
   wherein said compression means generates, even in the event that such changing point is not detected by said detecting means, a compressed image code representing the predetermined value, when said discriminating means discriminates that a count of said counting means has reached the predetermined value.

2. An apparatus according to claim 1, wherein said input means comprises reading means for reading the original image line by line and generating the binary signals.

3. An apparatus according to claim 1, wherein said compression means comprises memory means which is addressed by the count of said counting means to generate a corresponding compressed image code.

4. An apparatus according to claim 1, wherein said input means is adapted to enter clock signals each corresponding to the associated binary signal, and said counting means performs a counting operation based on the clock signals.

5. An apparatus according to claim 1, wherein said compression means is operable, after generating the compressed image code representing the predetermined value, to generate a compressed image code representing the remaining continuous number, when said changing point is detected by said detecting means.

6. An image data compression apparatus comprising:
   input means for entering on a line-by-line basis binary signals representing that each pel thereof is a white or a black pel;
   means for counting numbers of continuous white and black pels of the binary signals entered from said input means;
   means for detecting a changing point of the color related to the binary signals entered from said input means;
   compression means for generating a compressed image code representing a count of said counting means from detection of the changing point by said detecting means to detection of the next changing point by said detecting means; and
   means for converting, in the event that a first binary signal on a line entered from said input means represents a black pel, such binary signal into a binary signal representing a white pel.

7. An apparatus according to claim 6, wherein said input means comprises reading means for reading the original image line by line and generating the binary signals.

8. An apparatus according to claim 6, wherein said compression means comprises memory means which is addressed by the count of said counting means to generate a corresponding compressed image code.

9. An apparatus according to claim 6, wherein said input means is adapted to enter clock signals each corresponding to the associated binary signals, and said counting means performs a counting operation based on the clock signals.

10. An apparatus according to claim 6, wherein said input means is adapted to enter a period of time-signal representing an entering period of the binary signals on each line, and said converting means performs a conversion operation based on said period of time-signals.

* * * * *